United States Patent
Lee et al.

(10) Patent No.: US 9,859,345 B2
(45) Date of Patent: Jan. 2, 2018

(54) ORGANIC LIGHT EMITTING DISPLAY DEVICE INCLUDING A PARTITION WALL AND METHOD OF MANUFACTURING THE SAME

(71) Applicant: LG Display Co., Ltd., Seoul (KR)

(72) Inventors: Joon Suk Lee, Seoul (KR); Jae Sung Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/855,702

(22) Filed: Sep. 16, 2015

(65) Prior Publication Data

US 2016/0079325 A1 Mar. 17, 2016

(30) Foreign Application Priority Data

Sep. 17, 2014 (KR) .................. 10-2014-0123918
Jul. 31, 2015 (KR) .................. 10-2015-0109236

(51) Int. Cl.
*H01L 29/08* (2006.01)
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3248* (2013.01); *H01L 51/5237* (2013.01); *H01L 51/56* (2013.01); *H01L 27/3276* (2013.01); *H01L 2227/323* (2013.01)

(58) Field of Classification Search
CPC .................. H01L 51/5228; H01L 27/3246
See application file for complete search history.

(56) References Cited

U.S. PATENT DOCUMENTS

| | | |
|---|---|---|
| 2002/0158835 A1 | 10/2002 | Kobayashi et al. |
| 2005/0012454 A1 | 1/2005 | Yamazaki et al. |
| 2011/0037054 A1 | 2/2011 | Shieh et al. |
| 2012/0049207 A1 | 3/2012 | Kim et al. |
| 2012/0161167 A1* | 6/2012 | Yamazaki ........... H01L 27/3283 257/88 |
| 2012/0205675 A1 | 8/2012 | Ikeda et al. |
| 2014/0312329 A1* | 10/2014 | Fujii .................. H01L 51/5228 257/40 |

* cited by examiner

*Primary Examiner* — Thao X Le
*Assistant Examiner* — Laura Dykes
(74) *Attorney, Agent, or Firm* — Fenwick & West LLP

(57) ABSTRACT

An organic light emitting display device comprises a partition wall formed on a bank that covers a portion of an auxiliary electrode. The organic light emitting display device includes a first electrode, an auxiliary electrode, a first bank, and a partition wall. The first electrode may be connected to a driving transistor, and the auxiliary electrode may be disposed on the same layer as the first electrode. The first bank may cover a portion of the first electrode and a portion of the auxiliary electrode. A portion of a bottom surface of the partition wall may contact a top surface of the first bank, and the other portion except the portion of the bottom surface may be disposed on the auxiliary electrode.

17 Claims, 4 Drawing Sheets

ORGANIC LIGHT EMITTING DISPLAY DEVICE INCLUDING A PARTITION WALL AND METHOD OF MANUFACTURING THE SAME

CROSS-REFERENCE TO RELATED APPLICATIONS

This application claims the priority benefit of the Korean Patent Application No. 10-2014-0123918 filed on Sep. 17, 2014 and Korean Patent Application No. 10-2015-0109236 filed on Jul. 31, 2015, which are all hereby incorporated by reference as if fully set forth herein.

BACKGROUND OF THE INVENTION

Field of the Invention

The present invention relates to an organic light emitting display device, and more particularly, to an organic light emitting display device including a partition wall formed on a bank covering a portion of an auxiliary electrode and a method of manufacturing the same.

Description of the Related Art

As the times advance to the information-oriented society, flat panel display (FPD) which has good characteristics such as thinness, lightness, and low power consumption are increasing in importance. Examples of the FPD device includes liquid crystal display (LCD) device, plasma display panels (PDPs), organic light-emitting display device, etc. Recently, electrophoretic display (EPD) device is being widely used as one type of the FPD.

In particular, organic light emitting display device is a self-emitting device and has low power consumption, a fast response time, high emission efficiency, high luminance, and a wide viewing angle in comparison with other display devices. Therefore, the organic light emitting display device is attracting much attention as next-generation flat panel display.

FIG. 1 is a cross-sectional view illustrating a related art organic light emitting display device.

As illustrated in FIG. 1, the related art organic light emitting display device includes a substrate 10, a first electrode 11, an auxiliary electrode 15, a bank 20, an organic emission layer 12, a second electrode 13, an adhesive part 25, and a partition wall 30. The first electrode 11, the auxiliary electrode 15, and the bank 20 are formed on the substrate 10. The organic emission layer 12 is formed on the first electrode 11 and the bank 20. The second electrode 13 is formed on the organic emission layer 12. The adhesive part 25 is formed of the same material as that of the bank 20 and is disposed on a center portion of an upper surface of the auxiliary electrode 15. The partition wall 30 is formed on the adhesive part 25.

In this case, the organic emission layer 12 is divided into a plurality of parts respectively corresponding to a plurality of sub-pixels by the partition wall 30, and the second electrode (or a cathode) 13 is electrically connected to a partial region of the auxiliary electrode 15. In this case, the partial region of the auxiliary electrode 15 electrically connected to the cathode 13 may be changed in each of the plurality of sub-pixels depending on a manufacturing process. Therefore, a difference occurs between voltages respectively supplied to the plurality of sub-pixels, causing a reduction in luminance uniformity of the organic light emitting display device. Also, in consideration of such characteristic, when a width of the auxiliary electrode 15 is broadened, a width of the first electrode (or an anode) 11 is reduced. For this reason, an aperture ratio of each of the plurality of sub-pixels is reduced, and moreover, the image quality and lifetime the organic light emitting display device are reduced.

SUMMARY OF THE INVENTION

Accordingly, the present embodiments provide an organic light emitting display device and a method of manufacturing the same that substantially obviate one or more problems due to limitations and disadvantages of the related art.

An object of the present invention is to provide an organic light emitting display device in which a partition wall is formed on a bank covering a portion of a first electrode and a portion of an auxiliary electrode, and thus, an aperture ratio, image quality, and lifetime are enhanced.

In addition to the aforesaid objects of the present invention, other features and advantages of the present embodiments will be described below, but will be clearly understood by those skilled in the art from descriptions below.

Additional advantages and features of the embodiments will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device including a first electrode, an auxiliary electrode, a first bank, and a partition wall. The first electrode may be connected to a driving transistor, and the auxiliary electrode may be disposed on the same layer as the first electrode. The first bank may cover a portion of the first electrode and a portion of the auxiliary electrode. A portion of a bottom surface of the partition wall may contact a top surface of the first bank, and the other portion except the portion of the bottom surface may be disposed on the auxiliary electrode.

Further, according to an embodiment of the present invention, there is provided, the organic light emitting display device including a second bank configured to cover another portion of the auxiliary electrode which is opposite to the portion of the auxiliary electrode covered by the first bank, wherein the second bank is spaced apart from the partition wall by a certain width or more, and the partition wall is not disposed on the second bank.

Further, according to an embodiment of the present invention, there is provided, the organic light emitting display device including an organic emission layer on the first electrode and a second electrode on the organic emission layer, wherein the second electrode covers a portion of the top surface of the first bank and a whole top of the second bank.

Further, according to an embodiment of the present invention, there is provided, the organic light emitting display device including wherein the partition wall comprises a reverse taper structure.

Further, according to an embodiment of the present invention, there is provided, the organic light emitting display device including an organic emission layer on the first electrode and a second electrode on the organic emission layer, wherein the organic emission layer is insulated from, by the partition wall, an organic emission layer included in an adjacent sub-pixel.

Further, according to an embodiment of the present invention, there is provided, the organic light emitting display device including the organic emission layer is disposed on the auxiliary electrode, and the organic emission layer is not disposed under the other portion except the portion of the bottom surface of the partition wall contacted to the first bank.

Further, according to an embodiment of the present invention, there is provided, a method of manufacturing an organic light emitting display device including forming a first electrode connected to a driving transistor and an auxiliary electrode spaced apart from the first electrode; forming a first bank, which covers a portion of the first electrode and a portion of the auxiliary electrode, and a second bank that covers the other portion of the auxiliary electrode which is opposite to the portion of the auxiliary electrode covered by the first bank; and forming a partition wall, a portion of a bottom surface of the partition wall being contacted to a top surface of the first bank, and another portion except the portion of the bottom surface being disposed on the auxiliary electrode to be spaced apart from the auxiliary electrode.

Further, according to an embodiment of the present invention, there is provided, a method of manufacturing an organic light emitting display device including forming an organic emission layer on the first electrode, the first bank, the partition wall, the auxiliary electrode, and the second bank; and forming a second electrode on the organic emission layer and a portion of the auxiliary electrode which is not covered by the organic emission layer.

Further, according to an embodiment of the present invention, there is provided, a method of manufacturing an organic light emitting display device including the forming of the first electrode and the auxiliary electrode, the first electrode and the auxiliary electrode are formed of the same material on the same layer.

Further, according to an embodiment of the present invention, there is provided, a method of manufacturing an organic light emitting display device including coating partition wall materials on the first and second banks; irradiating light onto some materials of the partition wall materials located on a portion of a top surface of the first bank; removing some materials of the partition wall materials coated on a portion onto which the light is not irradiated; and curing some materials of the partition wall materials coated on a portion onto which the light is irradiated.

Further, according to an embodiment of the present invention, there is provided, a method of manufacturing an organic light emitting display device including the partition wall materials are negative type photoresists.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION OF THE INVENTION

Figure 1:
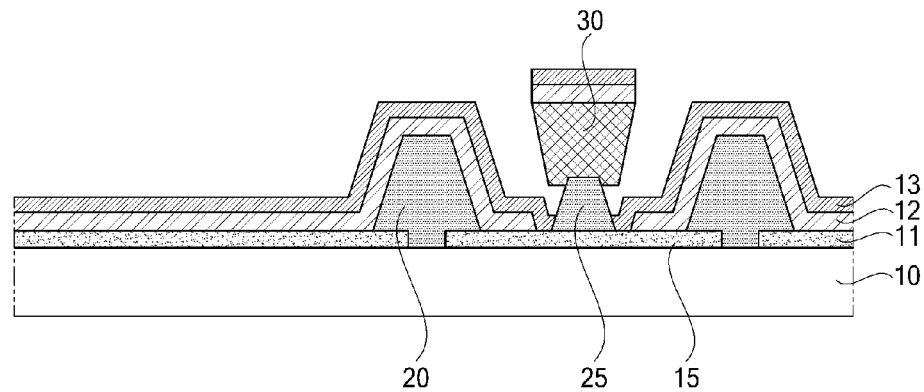
FIG. 1 is a cross-sectional view illustrating a related art organic light emitting display device.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this invention will be thorough and complete, and will fully convey the scope of the present invention to those skilled in the art. Furthermore, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, embodiments of the present invention will be described with reference to the accompanying drawings.

Figure 2:
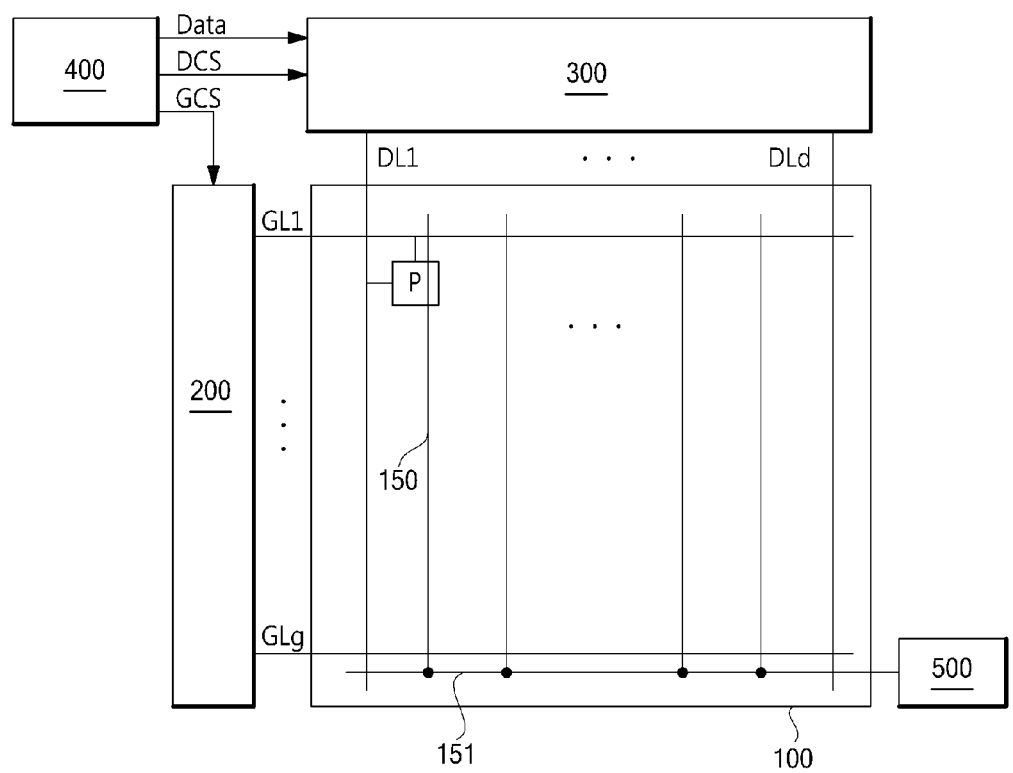
FIG. 2 is a plan view illustrating an organic light emitting display device according to an embodiment of the present invention.

FIG. 2 is a plan view illustrating an organic light emitting display device according to an embodiment of the present invention.

A display panel according to an embodiment of the present invention may be applied to the organic light emitting display device.

As illustrated in FIG. 2, the organic light emitting display device may include a display panel 100, a gate driver 200, a data driver 300, and a timing controller 400. The display panel 100 may include a plurality of sub-pixels P which are respectively provided in a plurality of areas defined by intersections of a plurality of gate lines GL1 to GLg and a plurality of data lines DL1 to DLd. In this case, the plurality of sub-pixels P may be defined by another means instead of the plurality of areas defined by intersections of the gate lines GL1 to GLg and the data lines DL1 to DLd. The gate driver 200 may supply a gate signal to the gate lines GL1 to GLg which are disposed in the display panel 100. The data driver 300 may respectively supply data signals to the data lines DL1 to DLd which are disposed in the display panel 100. The timing controller 400 may control a function of the gate driver 200 and a function of the data driver 300.

Each of the sub-pixels P may include an organic light emitting diode (OLED) emitting light and a driving circuit for driving the OLED.

The OLED may include an anode, an organic emission layer (or an organic compound layer), and a cathode. The anode may be connected to a transistor (TFT). A sealing part may be disposed on an upper end of the cathode.

The OLED may be implemented as a top emission type, where light emitted from the organic emission layer is irradiated in a direction from a lower substrate (or an array substrate) to an upper substrate, or a bottom emission type where the light emitted from the organic emission layer is irradiated in a direction from the upper substrate to the lower substrate (or the array substrate). The OLED may emit light having certain luminance according to a current supplied from a driving transistor.

The anode of the OLED may be electrically connected to a first power source. The cathode may be connected to a second power source 500 through a below-described auxiliary electrode. In this case, the auxiliary electrode may be electrically connected to a supply electrode 151 through a connection electrode disposed under the auxiliary electrode. Therefore, a plurality of supply electrodes 151 relevant to the sub-pixels P may be connected to the second power source 500 through a power supply line 155 in common.

The driving circuit may be electrically connected to a corresponding data line (hereinafter referred to as a data line) DL and a corresponding gate line (hereinafter referred to as a gate line) GL to control driving of the OLED. In this case, the driving circuit may include the driving transistor, a switching transistor, and a storage capacitor, but is not limited thereto. When the gate signal is supplied to the gate line GL, the driving circuit may control an amount of current supplied to the OLED according to a data signal supplied through the data line DL.

In this case, the driving transistor may be electrically connected between the first power source and the OLED. The switching transistor may be electrically connected to the driving transistor, the data line DL, and the gate line GL.

Figure 3:
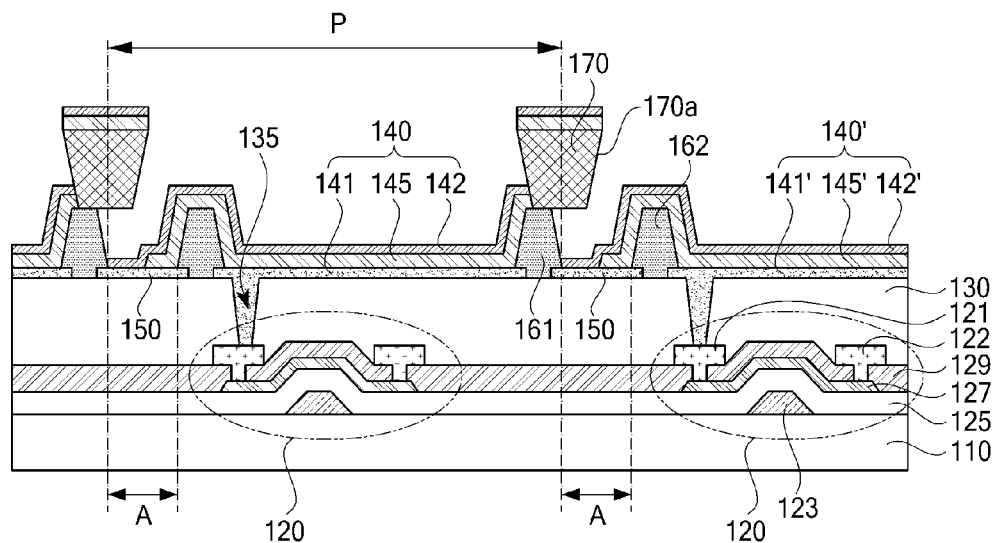
FIG. 3 is a cross-sectional view illustrating in detail an organic light emitting display device according to an embodiment of the present invention.

FIG. 3 is a cross-sectional view illustrating in detail an organic light emitting display device according to an embodiment of the present invention.

As illustrated in FIG. 3, the organic light emitting display device according to an embodiment of the present invention may include a driving transistor 120, a plurality of first electrodes 141 and 141', an auxiliary electrode 150, a first bank 161, a second bank 162, a partition wall 170, a plurality of organic emission layers 145 and 145', and a plurality of second electrodes 142 and 142'.

The driving transistor 120 may be disposed on a substrate 110. The first electrodes 141 and 141' may be electrically connected to the driving transistor 120. The auxiliary electrode 150 may be disposed on the same layer as the first electrodes 141 and 141' and may be disposed between the first electrodes 141 and 141' to be adjacent to the first electrodes 141 and 141'. The first bank 161 may cover a portion of the first electrode 141 and a portion of the auxiliary electrode 150. The second bank 162 may cover a portion of the first electrode 141' and another portion of the auxiliary electrode 150. The partition wall 170 may be disposed on the first bank 161. The organic emission layers 145 and 145' may be respectively disposed on the first electrodes 141 and 141'. The second electrodes 142 and 142' may be disposed, respectively, on the organic emission layers 145 and 145'.

The driving transistor 120 may be disposed on the substrate 110. The driving transistor 120 may include a gate electrode 123, a gate insulation layer 125, an active layer 127, an interlayer dielectric 129, a first driving electrode 121, and a second driving electrode 122. In this case, the first driving electrode 121 may be a source electrode, and the second driving electrode 122 may be a drain electrode. In other embodiments, the first driving electrode 121 may be the drain electrode, and the second driving electrode 122 may be the source electrode.

The driving transistor 120 may be disposed in each of a plurality of sub-pixels on the substrate 110. A configuration of the driving transistor 120 is not limited to the above-described example and may be variously modified to be easily implemented by those skilled in the art.

A passivation layer 130 may be disposed on the driving transistor 120. The passivation layer 130 may include a contact hole 135. The first driving electrode 121 of the driving transistor 120 may be electrically connected to the first electrodes 141 and 141' through the contact hole 135.

The first electrodes 141 and 141' may be disposed on the passivation layer 130. The first electrodes 141 and 141' may be electrically connected to the first driving electrode 121 through the contact hole 135. The first electrodes 141 and 141' may be disposed in each of a plurality of sub-pixels. Each of the first electrodes 141 and 141' may act as an anode electrode or a cathode electrode depending on the type of the driving transistor 120. For example, the first electrodes 141 and 141' may respectively perform functions of anodes of a plurality of organic light emitting diodes (OLEDs) 140 and 140' and may each include a transparent conductive material having a large work function value. For example, each of the first electrodes 141 and 141' may be formed of indium tin oxide (ITO), indium zinc oxide (IZO), and/or the like. Also, the first electrodes 141 and 141' may each include a metal material which is good in reflection efficiency. For example, each of the first electrodes 141 and 141' may be formed of at least two or more layers including aluminum (Al), silver (Ag), Ag;Pb;Cu (APC), and/or the like.

The auxiliary electrode 150 may be disposed on the passivation layer 130. In this case, the auxiliary electrode 150 may be disposed between the first electrodes 141 and 141' to be adjacent to the first electrodes 141 and 141'. Therefore, the auxiliary electrode 150 may be disposed on the same layer to be spaced apart from the first electrodes 141 and 141'. The auxiliary electrode 150 may be formed simultaneously with the first electrodes 141 and 141'. In this case, the auxiliary electrode 150 and the first electrodes 141 and 141' may be formed of the same material. The auxiliary electrode 150 may be connected to, for example, a second power source through an auxiliary electrode line. Here, the second power source may be a ground electrode.

The first bank 161 may be disposed on the passivation layer 130. Also, the first bank 161 may be disposed between the first electrode 141 and the auxiliary electrode 150. In this case, the first bank 161 may cover a portion of the first electrode 141 and a portion of the auxiliary electrode 150.

The second bank 162 may be disposed on the passivation layer 130. Also, the second bank 162 may be disposed between the first electrode 141' and the auxiliary electrode 150. In this case, the second bank 162 may cover another portion of the auxiliary electrode 150 which is opposite to the portion of the auxiliary electrode 150 covered by the first bank 161. Also, the second bank 162 may cover a portion of the first electrode 141' included in an adjacent sub-pixel.

The partition wall 170 may be disposed on the first bank 161. A portion (or a first portion) of a bottom of the partition wall 170 may contact a top surface of the first bank 161. Also, the other portion (or a second portion) except the portion of the bottom surface of the partition wall 170 may be disposed over the auxiliary electrode 150 to be spatially spaced apart from the auxiliary electrode 150. In this case, the other portion (or the second portion) except the portion (or the first portion) of the bottom surface of the partition wall 170 may not contact the top surface of the first bank 161. Therefore, the partition wall 170 may partially cover the top of the first bank 161. That is, the partition wall 170 may be disposed on one side of the top of the first bank 161. In this case, the one side of the top surface of the first bank 161 may be a portion (e.g., a direction of or toward the auxiliary electrode 150 instead of toward the first electrode 141) adjacent to the auxiliary electrode 150 with respect to a center line of the first bank 161. This is merely an embodiment, and in other embodiments, the partition wall 170 may be disposed on one side of a top surface of the second bank 162 instead of the top surface of the first bank 161. Here, the one side of the top surface of the second bank 162 may be a portion (e.g., a direction facing or toward the auxiliary electrode 150 instead of a direction toward the first electrode 141') adjacent to the auxiliary electrode 150 with respect to a center line of the second bank 162.

The partition wall 170 may be spaced apart from the second bank 162 by a certain width or more. The certain width may be, for example, 5 μm. In this case, the partition wall 170 may not be disposed on the second bank 162. A portion of a top surface of the partition wall 170 may be disposed on the auxiliary electrode 150, but may not be disposed on the second bank 162. Therefore, an end of the top surface of the partition wall 170 in a direction toward the auxiliary electrode 150 may be spaced apart from, by a certain horizontal distance, an end of a bottom surface of the second bank 162 in a direction toward the auxiliary electrode 150. In this case, the certain horizontal distance may be a certain width. That is, the certain width may be a minimum distance from the partition wall 170 to the second bank 162. The partition wall 170 may be spaced apart from the second bank 162 by a certain width or more. Therefore, when the second electrode 142' is formed, the second electrode 142' may be connected to a connection portion A of the auxiliary electrode 150 in each sub-pixel P. Here, the connection portion A may be a portion of the auxiliary electrode 150 which is not covered by the first and second banks 161 and 162.

Moreover, the second electrodes 142 and 142' may be connected to the auxiliary electrode 150 in each sub-pixel P, and thus, an auxiliary voltage may be applied to the second electrodes 142 and 142' of each sub-pixel P through the auxiliary electrode 150. Therefore, the luminance uniformity of an organic light emitting display device is enhanced.

Moreover, the partition wall 170 may be disposed on the first bank 161, and thus, a width of the auxiliary electrode 150 may be reduced by a width of a bottom surface of the partition wall 170. Therefore, a width of each of the first electrodes 141 and 141' disposed on the same layer may increase by a width of the auxiliary electrode 150. Accordingly, an opening width of the first electrode 141 may become broader. Therefore, an aperture ratio of each sub-pixel is enhanced. Also, as the aperture ratio is enhanced, the image quality and lifetime of an organic light emitting display device are enhanced.

The partition wall 170 may have a reverse taper structure where a width of a bottom surface of the partition wall 170 is narrower than that of a top surface of the partition wall 170. The reverse taper structure may be a structure where both side surfaces of the partition wall 170 are inclined to be symmetrical about a center line and the width of the bottom surface of the partition wall 170 is narrower than that of the top surface of the partition wall 170. Side surfaces of the partition wall 170 may include one or more inclined surfaces 170a, but the present embodiment is not limited thereto. In other embodiments, the side surfaces of the partition wall 170 may include two or more inclined surfaces.

The organic emission layers 145 and 145' may be formed all over the substrate 110. In this case, the organic emission layers 145 and 145' may be respectively disposed on the first electrodes 141 and 141'. The organic emission layers 145 and 145' may be disposed on the first electrode 141 which is not covered by the first bank 161 and the second bank 162. Also, the organic emission layers 145 and 145' may be disposed on the first bank 161 and the second bank 162. In this case, the organic emission layers 145 and 145' may cover a portion of a top surface of the first bank 161 and a whole top surface of the second bank 162. Also, the organic emission layers 145 and 145' may be disposed on the partition wall 170 and the auxiliary electrode 150. The organic emission layers 145 and 145' may be disposed all over the substrate 110 by evaporation. In this case, the partition wall 170 may block the deposited organic emission layers 145 and 145'. Therefore, the organic emission layers 145 and 145' may be disposed on the partition wall 170 and may not be disposed under a portion (or a second portion) of the bottom surface of the partition wall 170 which does not contact the first bank 161. Therefore, each of the organic emission layers 145 and 145' may be divided into a plurality of parts respectively corresponding to the plurality of sub-pixels P by the partition wall 170 disposed on the first bank 161. Therefore, the organic emission layer 145 disposed in one sub-pixel P may be insulated from an organic emission layer 145' disposed in another adjacent sub-pixel P. Each of organic emission layers 145 and 145' may be formed to have a structure of a hole transport layer/emission layer/electron transport layer or a structure of a hole injection layer/hole transport layer/emission layer/electron transport layer/electron injection layer. Furthermore, each of organic emission layers 145 and 145' may further include a function layer for enhancing the emission efficiency and/or lifetime of the emission layer. In the structure of the organic emission layer, one or more layers may include a function of another layer. Therefore, one or more layers may be removed or added, and thus, the structure of each of organic emission layers 145 and 145' is not limited thereto.

The second electrodes 142 and 142' may be respectively formed all over the organic emission layers 145 and 145'. That is, the second electrodes 142 and 142' may be respectively disposed on the organic emission layers 145 and 145'. The second electrodes 142 and 142' may also be respectively disposed on the organic emission layers 145 and 145' covering the first and second banks 161 and 162. In this case, the second electrodes 142 and 142' may cover a portion of the top surface of the first bank 161 and the whole top surface of the second bank 162. Also, the second electrodes 142 and 142' may be disposed on the partition wall 170 and the auxiliary electrode 150. When the second electrodes 142 and 142' are deposited all over the substrate 110, the second electrodes 142 and 142' may be deposited through diffusion caused by plasma. Therefore, the second electrodes 142 and 142' may be deposited under the portion (or the second portion) of the bottom surface of the partition wall 170 which does not contact the first bank 161 blocked by the partition wall 170. Therefore, the second electrodes 142 and 142' may be disposed on a portion of the auxiliary electrode 150 which is not covered by the organic emission layers 145 and 145'. Therefore, the second electrodes 142 and 142' may be electrically connected to the auxiliary electrode 150. When the partition wall 170 is disposed on the first bank 161, for example, the second electrode 142' covering the whole top surface of the second bank 162 may be electrically connected to the auxiliary electrode 150. The second electrode 142 covering a portion of the top surface of the first bank 161 may not be electrically connected to the auxiliary electrode 150. Also, when the partition wall 170 is disposed on the second bank 162, for example, the second electrode 142 covering the whole top surface of the first bank 161 may be electrically connected to the auxiliary electrode 150. The second electrode 142' covering a portion of the top surface of the second bank 162 may not be electrically connected to the auxiliary electrode 150.

As described above, the partition wall 170 may be disposed on one of the first and second banks 161 and 162. Therefore, one of the second electrodes 142 and 142' may be electrically connected to the auxiliary electrode 150. That is, one of the second electrodes 142 and 142' next to both sides of the auxiliary electrode 150 may be electrically connected to the auxiliary electrode 150. Therefore, a width of the auxiliary electrode 150 may be more reduced than when the second electrodes 142 and 142' next to or on both sides of the auxiliary electrode 150 are electrically connected to the auxiliary electrode 150. A width of each of the first electrodes 141 and 141' disposed on the same layer as the auxiliary electrode 150 may increase to a degree to which a width of the auxiliary electrode 150 is reduced. Therefore, an opening width of each of the first electrodes 141 and 141' may become broader. Therefore, an aperture ratio of each sub-pixel is enhanced. Also, as the aperture ratio is enhanced, the image quality and lifetime of an organic light emitting display device are enhanced.

If each of the first electrodes 141 and 141' functions as an anode electrode, each of the second electrodes 142 and 142' may function as a cathode electrode. The second electrodes 142 and 142' may use a metal material which is very thin in thickness and is low in work function. For example, each of the second electrodes 142 and 142' may use a metal material such as Ag, Ti, Al, Mo, an alloy of Ag and Mg, and/or the like. In this case, each of the second electrodes 142 and 142' may be formed of the metal material to have a thickness (for example, 200 angstrom (Å) or less) of hundreds Å or less. Therefore, each of the second electrodes 142 and 142' may be formed of a semi-transmissive layer and may be substantially used as a transparent cathode. However, the present embodiment is not limited thereto, and in other embodiments, each of the second electrodes 142 and 142' may use carbon nano tube, graphene, and/or the like. Also, in order to lower a resistance of each of the second electrodes 142 and 142', a material such as ITO, IZO, and/or the like having a high transmittance may be additionally deposited on each of the second electrodes 142 and 142'.

The OLED 140, as described above, may include the first electrodes 141 and 141', the organic emission layers 145 and 145', and the second electrodes 142 and 142'. Also, the OLED 140 may be disposed in each sub-pixel P and may emit light according to driving of the driving transistor 120.

FIGS. 4A to 4E are cross-sectional views for describing a method of manufacturing an organic light emitting display device according to an embodiment of the present invention. Particularly, FIGS. 4A to 4E illustrate respective cross-section views of a plurality of operations included in the method of manufacturing the organic light emitting display device according to an embodiment of the present invention.

Figure 4A:
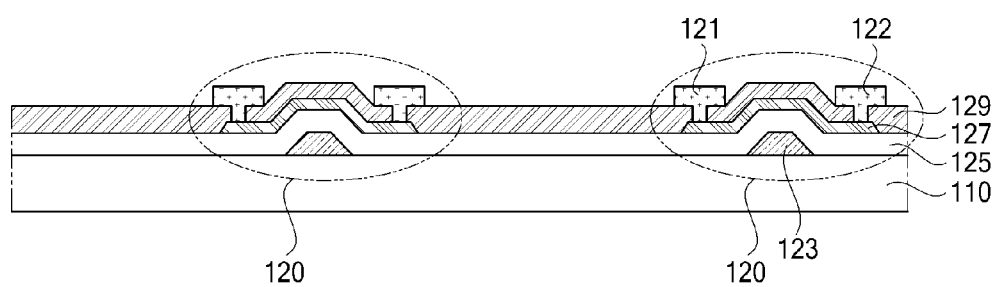
FIGS. 4A to 4E are cross-sectional views for describing a method of manufacturing an organic light emitting display device according to an embodiment of the present invention.

First, as illustrated in FIG. 4A, the driving transistor 120 including the gate electrode 123, the gate insulation layer 125, the active layer 127, the interlayer dielectric 129, the first driving electrode 121, and the second driving electrode 122 may be formed on the substrate 110.

The gate electrode 123 may be formed on the substrate 110. The gate electrode 123 may be formed of one of Mo, Al, Cr, Au, Ti, Ni, Nd, and Cu or an alloy thereof, but is not limited thereto. In other embodiments, the gate electrode 123 may be formed of various materials. Also, the gate electrode 123 may be formed of a single layer or a multilayer.

The gate insulation layer 125 may be formed on the gate electrode 123. The gate insulation layer 125 may insulate the gate electrode 123 from the active layer 127 which will be formed later. In this case, the gate insulation layer 125 may be formed of silicon oxide (SiOx), silicon nitride (SiNx), or a multilayer thereof, but is not limited thereto.

The active layer 127 may be formed on the gate insulation layer 125. The active layer 127 may be formed of amorphous silicon, polycrystalline silicon, an oxide semiconductor, and the like.

The interlayer dielectric 129 may be formed on the active layer 127. In this case, the interlayer dielectric 129 may be formed of the same material as that of the gate insulation layer 125, but is not limited thereto.

The first driving electrode 121 and the second driving electrode 122 may be formed on the interlayer dielectric 129. Each of the first driving electrode 121 and the second driving electrode 122 may be formed of one of Mo, Al, Cr, Au, Ti, Ni, Nd, and Cu or an alloy thereof, but is not limited thereto. In other embodiments, each of the first driving electrode 121 and the second driving electrode 122 may be formed of various materials. Also, each of the first driving electrode 121 and the second driving electrode 122 may be formed of a single layer or a multilayer.

The driving transistor 120 may be disposed in each of a plurality of sub-pixels on the substrate 110. A configuration of the driving transistor 120 is not limited to the above-described example and may be variously modified to be easily implemented by those skilled in the art.

Figure 4B:
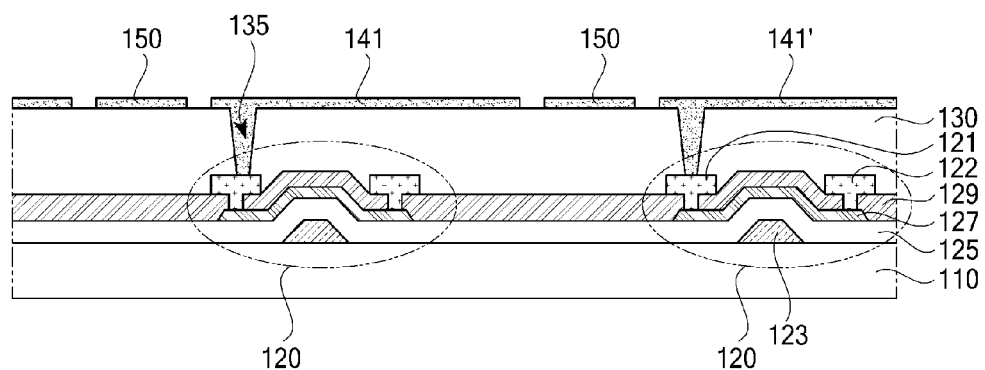

Subsequently, as illustrated in FIG. 4B, the passivation layer 130, the first electrodes 141 and 141', and the auxiliary electrode 150 may be disposed on the driving transistor 120. The passivation layer 130 may be formed on the driving transistor 120. The passivation layer 130 may include the contact hole 135. In this case, the first driving electrode 121 of the driving transistor 120 may be connected to the first electrodes 141 and 141' through the contact hole 135. The passivation layer 130 may protect the driving transistor 120. The passivation layer 130 may be formed of, for example, one or more of polyacrylates resin, epoxy resin, phenolic resin, polyamides resin, polyimides resin, unsaturated polyesters resin, poly-phenylenethers resin, polyphenylenesulfides resin, benzocyclobutene, and/or the like, but is not limited thereto.

The first electrodes 141 and 141' may be formed on the passivation layer 130. The first electrodes 141 and 141' may be formed to be electrically connected to the first driving electrode 121 through the contact hole 135. The first electrodes 141 and 141' may be formed in each of the plurality of sub-pixels in common and may be patterned through a photolithography process. Each of the first electrodes 141 and 141' may act as an anode electrode or a cathode electrode depending on the type of the driving transistor 120. For example, the first electrodes 141 and 141' may respectively perform functions of anodes of a plurality of organic light emitting diodes (OLEDs) 140 and 140' and may each include a transparent conductive material having a large work function value. For example, each of the first electrodes 141 and 141' may be formed of indium tin oxide (ITO), indium zinc oxide (IZO), and/or the like. Also, the first electrodes 141 and 141' may each include a metal material which is good in reflection efficiency. For example, each of the first electrodes 141 and 141' may be formed of at least two or more layers including aluminum (Al), silver (Ag), Ag;Pb;Cu (APC), and/or the like.

The auxiliary electrode 150 may be formed on the passivation layer 130. In this case, the auxiliary electrode 150 may be disposed between the first electrodes 141 and 141'. Therefore, the auxiliary electrode 150 may be formed on the same layer to be spaced apart from the first electrodes 141 and 141'. The auxiliary electrode 150 may be formed simultaneously with the first electrodes 141 and 141'. In this case, the auxiliary electrode 150 and the first electrodes 141 and 141' may be formed of the same material.

Figure 4C:
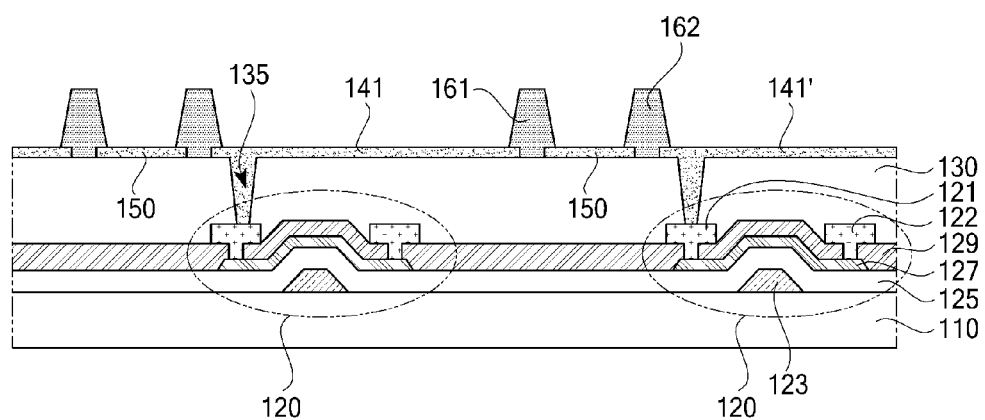

As illustrated in FIG. 4C, the first bank 161 and the second bank 162 may be formed on the passivation layer 130.

The first bank 161 may be formed on the passivation layer 130. Also, the first bank 161 may be formed between the first electrode 141 and the auxiliary electrode 150. In this case, the first bank 161 may cover a portion of the first electrode 141 and a portion of the auxiliary electrode 150.

The second bank 162 may be formed on the passivation layer 130. Also, the second bank 162 may be formed between the first electrode 141' and the auxiliary electrode 150. In this case, the second bank 162 may cover another portion of the auxiliary electrode 150 which is opposite to the portion of the auxiliary electrode 150 covered by the first bank 161. Also, the second bank 162 may cover a portion of the first electrode 141' included in an adjacent sub-pixel. In this case, each of the first and second banks 161 and 162 may be formed of an organic insulating material, for example, one of photo acryl, benzocyclobutene (BCB), etc., but is not limited thereto.

Figure 4D:
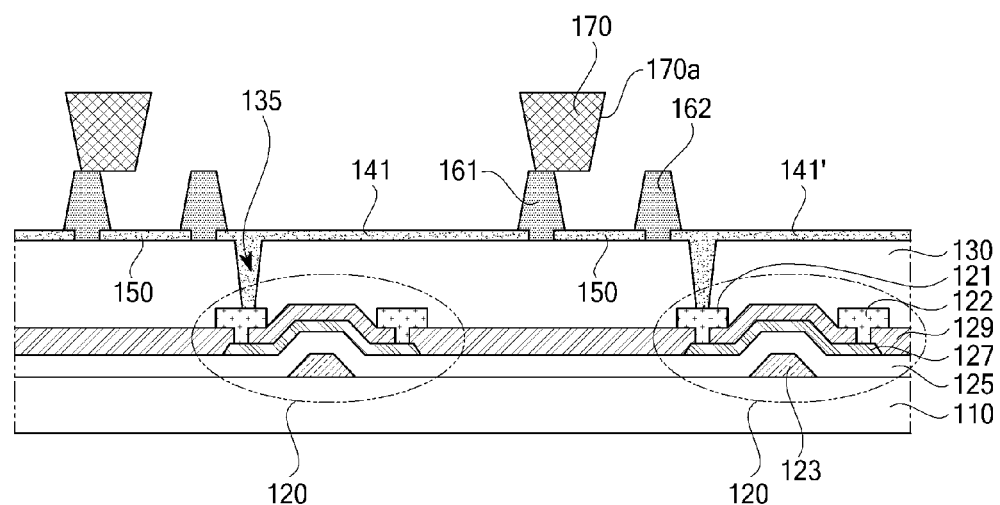

As illustrated in FIG. 4D, the partition wall 170 may be formed on the first bank 161.

The partition wall 170 may be formed on the first bank 161. A portion (a first portion) of a bottom surface of the partition wall 170 may contact a top of the first bank 161. Also, the other portion (a second portion) except the portion of the bottom surface of the partition wall 170 may be formed over the auxiliary electrode 150 to be spatially spaced apart from the auxiliary electrode 150. In this case, the other portion (the second portion) except the portion (the first portion) of the bottom surface of the partition wall 170 may not contact the top surface of the first bank 161. Therefore, the partition wall 170 may partially cover the top surface of the first bank 161. That is, the partition wall 170 may be disposed on one side of the top surface of the first bank 161 (e.g., offset with respect to the center of the first bank 161). In this case, the one side of the top surface of the first bank 161 may be a portion (e.g., a direction looking at the auxiliary electrode 150 instead of a direction toward the first electrode 141) adjacent to the auxiliary electrode 150 with respect to a center line of the first bank 161. This is merely an embodiment, and in other embodiments, the partition wall 170 may be formed on one side of a top surface of the second bank 162 instead of the top surface of the first bank 161. Here, the one side of the top surface of the second bank 162 may be a portion (e.g., a direction looking at the auxiliary electrode 150 instead of a direction toward the first electrode 141') adjacent to the auxiliary electrode 150 with respect to a center line of the second bank 162. Also, the partition wall 170 may be formed to be spaced apart from the second bank 162 by a certain width or more.

The partition wall 170 may have a reverse taper structure where a width of a bottom surface of the partition wall 170 is narrower than that of a top surface of the partition wall 170. The reverse taper structure may be a structure where both side surfaces of the partition wall 170 are inclined to be symmetrical about a center line and the width of the bottom surface of the partition wall 170 is narrower than that of the top of the partition wall 170. Side surfaces of the partition wall 170 may include one or more inclined surfaces 170a, but the present embodiment is not limited thereto. In other embodiments, the side surfaces of the partition wall 170 may include two or more inclined surfaces. In this case, the partition wall having the reverse taper structure may be formed of a negative type photoresist. The negative type photoresist may be a photosensitive material where a portion exposed to light is cured and thus is formed as a pattern, and a portion unexposed to the light is rinsed out by a solvent.

A process of forming the partition wall 170 may include: an operation of coating partition wall materials on the first and second banks 161 and 162; an operation of irradiating light onto some materials of the partition wall materials by using a patterned mask; an operation of removing some materials of the partition wall materials located on a portion onto which the light is not irradiated; and an operation of curing some materials of the partition wall materials remaining on a portion onto which the light is irradiated.

First, the partition wall materials may be coated on the first and second banks 161 and 162. The partition wall materials may use the negative type photoresist. The partition wall materials may be coated by a spin coating method. The spin coating method may be a coating method that drops a coating material onto a substrate and rotates the substrate at a high speed to thinly spread the coating material at a certain thickness, thereby coating the coating material on the substrate. However, the present embodiment is not limited thereto, and in other embodiments, the partition wall 170 may be formed by a roll coating method, a slit coating, and the like.

Subsequently, the light may be irradiated onto the partition wall materials by using the patterned mask. In this case, the patterned mask may be located on the partition wall materials. The light may be irradiated onto the partition wall materials through the mask. In this case, the mask may be located on the partition wall materials, and the light may be irradiated onto only the partition wall materials located on a portion of the top surface of the first bank 161 (or the second bank 162). Therefore, the light may not be irradiated onto the other portion where the partition wall is not formed.

Subsequently, some materials of the partition wall materials located on a portion onto which the light is not irradiated may be removed. Some materials of the partition wall materials coated on the portion onto which the light is not irradiated may be removed, and some materials of the partition wall materials coated on a portion onto which the light is irradiated may remain.

Finally, the partition wall 170 may be formed by curing some materials of the partition wall materials coated on the portion onto which the light is irradiated.

As described above, the partition wall 170 may be disposed on the top surface of the first bank 161. Thus, a width of the auxiliary electrode 150 may be reduced by a width of a bottom surface of the partition wall 170. Therefore, a width of each of the first electrodes 141 and 141' disposed on the same layer may increase by a width of the auxiliary electrode 150. Accordingly, an opening width of the first electrode 141 may become broader. Therefore, an aperture ratio of each sub-pixel is enhanced. Also, as the aperture ratio is enhanced, the image quality and lifetime of an organic light emitting display device are enhanced.

Figure 4E:
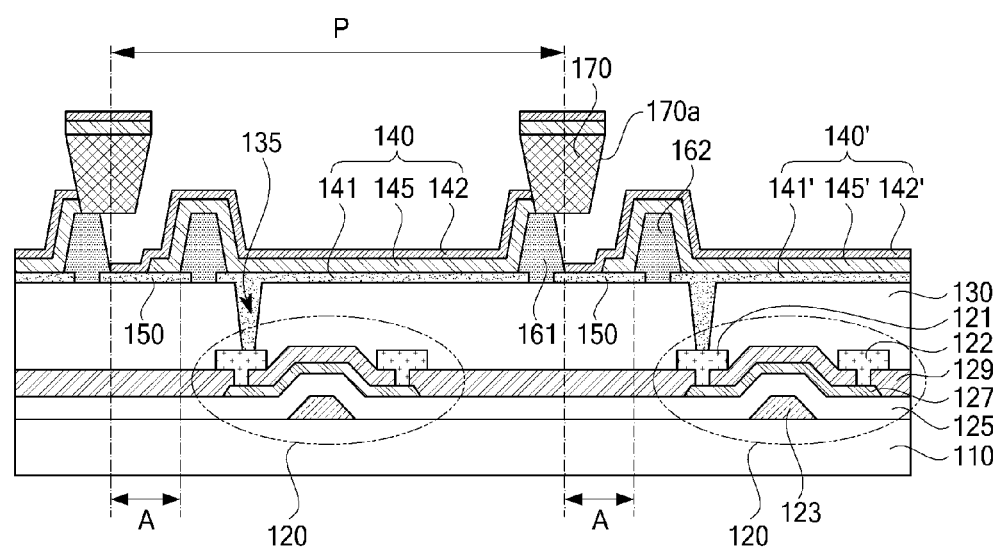

As illustrated in FIG. 4E, the organic emission layers 145 and 145' and the second electrodes 142 and 142' may be formed all over the substrate 110.

The organic emission layers 145 and 145' may be formed all over the substrate 110. In this case, the organic emission layers 145 and 145' may be respectively formed on the first electrodes 141 and 141'. The organic emission layers 145 and 145' may be formed on the first electrode 141 which is not covered by the first bank 161 and the second bank 162. Also, the organic emission layers 145 and 145' may be formed on the first bank 161 and the second bank 162. In this case, the organic emission layers 145 and 145' may cover a portion of a top surface of the first bank 161 and a whole top surface of the second bank 162. Also, the organic emission layers 145 and 145' may be formed on the partition wall 170 and the auxiliary electrode 150. The organic emission layers 145 and 145' may be formed all over the substrate 110 by evaporation. In this case, the partition wall 170 may block the deposited organic emission layers 145 and 145'. Therefore, the organic emission layers 145 and 145' may be formed on the partition wall 170 and may not be formed under a portion (a second portion) of the bottom surface of the partition wall 170 which does not contact the first bank 161. Therefore, each of the organic emission layers 145 and 145' may be divided into a plurality of parts respectively corresponding to the plurality of sub-pixels P by the partition wall 170 formed on the first bank 161. Therefore, the organic emission layer 145 formed in one sub-pixel P may be insulated from an organic emission layer 145 formed in another adjacent sub-pixel P, and the organic emission layer 145' formed in one sub-pixel P may be insulated from an organic emission layer 145' formed in another adjacent sub-pixel P. Each of organic emission layers 145 and 145' may be formed to have a structure of a hole transport layer/emission layer/electron transport layer or a structure of a hole injection layer/hole transport layer/emission layer/ electron transport layer/electron injection layer. Furthermore, each of organic emission layers 145 and 145' may further include a function layer for enhancing the emission efficiency and/or lifetime of the emission layer. In the structure of the organic emission layer, one or more layers may include a function of another layer. Therefore, one or more layers may be removed or added, and thus, the structure of each of organic emission layers 145 and 145' is not limited thereto.

The second electrodes 142 and 142' may be respectively formed all over the substrate 110 including the organic emission layers 145 and 145'. The second electrodes 142 and 142' may be respectively formed on the organic emission layers 145 and 145'. The second electrodes 142 and 142' may also be respectively formed on the organic emission layers 145 and 145' covering the first and second banks 161 and 162. In this case, the second electrodes 142 and 142' may cover a portion of the top surface of the first bank 161 and the whole top surface of the second bank 162. Also, the second electrodes 142 and 142' may be formed on the partition wall 170 and the auxiliary electrode 150. When the second electrodes 142 and 142' are deposited all over the substrate 110, the second electrodes 142 and 142' may be deposited through diffusion caused by plasma. Therefore, the second electrodes 142 and 142' may be deposited under the portion (the second portion) of the bottom surface of the partition wall 170 which does not contact the first bank 161 blocked by the partition wall 170. Therefore, the second electrodes 142 and 142' may be formed on a portion of the auxiliary electrode 150 which is not covered by the organic emission layers 145 and 145'. Therefore, the second electrodes 142 and 142' may be electrically connected to the auxiliary electrode 150. When the partition wall 170 is formed on the first bank 161, for example, the second electrode 142' covering the whole top surface of the second bank 162 may be electrically connected to the auxiliary electrode 150.

If each of the first electrodes 141 and 141' functions as an anode electrode, each of the second electrodes 142 and 142' may function as a cathode electrode. The second electrodes 142 and 142' may use a metal material which is very thin in thickness and is low in work function. For example, each of the second electrodes 142 and 142' may use a metal material such as Ag, Ti, Al, Mo, an alloy of Ag and Mg, and/or the like. In this case, each of the second electrodes 142 and 142' may be formed of the metal material to have a thickness (for example, 200 angstrom (Å) or less) of hundreds Å or less. Therefore, each of the second electrodes 142 and 142' may be formed of a semi-transmissive layer and may be substantially used as a transparent cathode. However, the present embodiment is not limited thereto, and in other embodiments, each of the second electrodes 142 and 142' may use carbon nano tube, graphene, and/or the like. Also, in order to lower a resistance of each of the second electrodes 142 and 142', a material such as ITO, IZO, and/or the like having a high transmittance may be additionally deposited on each of the second electrodes 142 and 142'.

The OLED 140, as described above, may include the first electrode 141, the organic emission layer 145, and the second electrode 142. Also, the OLED 140 may be disposed in each sub-pixel P and may emit light according to driving of the driving transistor 120.

Moreover, although not shown in the drawing, a sealing part may be formed on the substrate 110 that includes the OLED 140 and the driving transistor 120. The sealing part protects the elements, such as the OLED 140, the driving transistor 120, etc., from external impact and prevents the penetration of water.

According to the embodiments, a thin film transistor (TFT) may have a top gate structure or a bottom gate structure.

As described above, according to the embodiments of the present invention, since the partition wall is formed on the bank, each of the plurality of pixel areas increases, and an aperture ratio is enhanced.

Moreover, according to the embodiments of the present invention, the luminance uniformity and image quality of an organic light emitting display device are enhanced.

It will be apparent to those skilled in the art that various modifications and variations can be made in the present invention without departing from the spirit or scope of the inventions. Thus, it is intended that the present invention covers the modifications and variations of these embodiments provided they come within the scope of the appended claims and their equivalents.

What is claimed is:

1. An organic light emitting display device including a partition wall comprising:
    a first electrode connected to a driving transistor;
    an auxiliary electrode on a same layer as the first electrode;
    a first bank configured to cover one end of the first electrode and to cover one end of the auxiliary electrode; a second bank configured to cover and contact an opposing end of the auxiliary electrode; and
    the partition wall on the first bank and having a bottom surface with a first portion contacting a top surface of the first bank and a second portion not contacting the top surface of the first bank, the second portion and the auxiliary electrode spaced apart from each other to have a gap therebetween, wherein the partition wall is not in contact with the auxiliary electrode and the partition wall is not in contact with the first electrode and wherein the second bank is spaced apart from the partition wall by a certain width or more, and the partition wall is not disposed on the second bank.

2. The organic light emitting display device of claim 1, further comprising:
    an organic emission layer on the first electrode
    wherein the organic emission layer covers a portion of the top surface of the first bank and a whole top of the second bank, and
    wherein the organic emission layer extends onto a portion of the auxiliary electrode but does not extend into the gap between the second portion and the auxiliary electrode.

3. The organic light emitting display device of claim 2, wherein the partition wall comprises a reverse taper structure.

4. The organic light emitting display device of claim 3, wherein the organic emission layer is insulated from, by the partition wall, an organic emission layer included in an adjacent sub-pixel.

5. The organic light emitting display device of claim 4, further comprising:
    a second electrode covering the organic emission layer over the portion of the top surface of the first bank, the whole top of the second bank, to extend onto the portion of the auxiliary electrode and extending into the gap between the second portion and the auxiliary electrode to contact with the auxiliary electrode.

6. A method of manufacturing an organic light emitting display device, the method comprising:
    forming a first electrode connected to a driving transistor and an auxiliary electrode spaced apart from the first electrode;
    forming a first bank, which covers one end of the first electrode and one end of the auxiliary electrode, and a second bank that covers and contacts an opposing end of the auxiliary electrode; and
    forming a partition wall on the first bank and having a bottom surface with a first portion contacting to a top surface of the first bank and a second portion not contacting the top surface of the first bank, the second portion and the auxiliary electrode spaced apart from each other to have a gap therebetween, wherein the partition wall is not in contact with the auxiliary electrode and the partition wall is not in contact with the first electrode and wherein the second bank is spaced apart from the partition wall by a certain width or more, and the partition wall is not disposed on the second bank.

7. The method of claim 6, further comprising:
    forming an organic emission layer on the first electrode, the first bank, the partition wall, the auxiliary electrode, and the second bank; and
    forming a second electrode on the organic emission layer and a portion of the auxiliary electrode which is not covered by the organic emission layer.

8. The method of claim 7, wherein the second electrode covers the organic emission layer over the portion of the top surface of the first bank, a whole top of the second bank, to extend onto the portion of the auxiliary electrode and extends into the gap between the second portion and the auxiliary electrode to contact with the auxiliary electrode.

9. The method of claim 6, wherein in the forming of the first electrode and the auxiliary electrode, the first electrode and the auxiliary electrode are formed of a same material on a same layer.

10. The method of claim 6, wherein the forming of the partition wall comprises:
    coating partition wall materials on the first and second banks;
    irradiating light onto some materials of the partition wall materials located on the portion of a top surface of the first bank and not located on the top of the first bank being disposed on the auxiliary electrode;
    removing some materials of the partition wall materials coated on a portion onto which the light is not irradiated; and
    curing some materials of the partition wall materials coated on a portion onto which the light is irradiated.

11. The method of claim 10, wherein the partition wall materials are negative type photoresists.

12. A display device comprising:
    a substrate having a matrix of pixels, each pixel having at least three sub-pixels, each sub-pixel having an organic light emitting layer that operatively emits light according to electrical characteristics created between a first electrode and a second electrode;
    an auxiliary electrode on a same plane as and in between two first electrodes that are respectively part of two adjacent sub-pixels;
    a bank having a first bank portion located between the first electrode and the auxiliary electrode covering one edge of the first electrode and covering one edge of the auxiliary electrode; and a second bank portion located between the first electrode and another auxiliary electrode of an adjacent sub-pixel covering an opposing edge of the first electrode and covering and contacting one edge of the another auxiliary electrode; and a partition on the bank and the partition not in contact with the auxiliary electrode and the partition not in contact with the first electrode, the partition having a reverse taper overhang structure configured to achieve an enhanced aperture ratio when compared to a display device that lacks the partition having the reverse taper overhang structure wherein the partition is on the first bank portion and has a bottom surface with a first area contacting a top surface of the first bank portion and a second area not contacting the top surface of the first bank portion, the second area and the auxiliary electrode spaced apart from each other to have a gap therebetween.

13. The device of claim 12, wherein the partition is located on top of either the first bank portion to provide overhead coverage with respect to a portion of the auxiliary electrode.

14. The device of claim 13, wherein the enhanced aperture ratio is achieved by having the partition located on top of either the first bank portion, instead of the partition being located between the first bank portion and the second bank portion.

15. The device of claim 12, wherein a reverse taper angle of the partition is configured to allow the second electrode to be configured to achieve direct electrical contact on the auxiliary electrode by preventing the organic light emitting layer from covering an entirety of the auxiliary electrode.

16. The device of claim 15, wherein the reverse taper overhang structure of the partition result in the organic light emitting layers and the second electrodes between adjacent sub-pixels being partitioned.

17. The device of claim 16, further comprising a driving thin-film transistor (TFT) located below the organic light emitting layer of each sub-pixel, whereby the first electrode is connected to a source or drain of the driving TFT.

* * * * *